(12) United States Patent
Javier et al.

(10) Patent No.: US 10,366,947 B2
(45) Date of Patent: *Jul. 30, 2019

(54) FLAT NO-LEAD PACKAGES WITH ELECTROPLATED EDGES

(71) Applicant: TEXAS INSTRUMENTS INCORPORATED, Dallas, TX (US)

(72) Inventors: Reynaldo Corpuz Javier, Plano, TX (US); Alok Kumar Lohia, Dallas, TX (US); Andy Quang Tran, Grand Prairie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/438,533

(22) Filed: Feb. 21, 2017

(65) Prior Publication Data

US 2017/0162489 A1 Jun. 8, 2017

Related U.S. Application Data

(60) Continuation of application No. 15/162,807, filed on May 24, 2016, now Pat. No. 9,576,886, which is a
(Continued)

(51) Int. Cl.
*H01L 21/44* (2006.01)
*H01L 23/495* (2006.01)
(Continued)

(52) U.S. Cl.
CPC .... *H01L 23/49582* (2013.01); *H01L 21/4821* (2013.01); *H01L 23/293* (2013.01); *H01L 23/3675* (2013.01); *H01L 23/49503* (2013.01); *H01L 23/49541* (2013.01); *H01L 23/49548* (2013.01); *H01L 23/49568* (2013.01); *H01L 23/49579* (2013.01); *H01L 24/09* (2013.01); *H01L 24/29* (2013.01); *H01L 24/46* (2013.01); *H01L 24/97* (2013.01); *H01L 21/561* (2013.01); *H01L 23/3107* (2013.01); *H01L 2224/2908* (2013.01); *H01L 2224/29144* (2013.01); *H01L 2224/29155* (2013.01); *H01L 2224/29164* (2013.01); *H01L 2224/32245* (2013.01);
(Continued)

(58) Field of Classification Search
CPC ......... H01L 23/49582; H01L 23/49503; H01L 23/49579; H01L 23/49568; H01L 21/4821; H01L 24/42; H01L 2224/42
USPC .................................. 257/666; 438/617, 123
See application file for complete search history.

(56) References Cited

U.S. PATENT DOCUMENTS

5,459,102 A 10/1995 Shibata et al.
6,489,218 B1 * 12/2002 Kim .................... H01L 21/4828
257/E23.124
(Continued)

*Primary Examiner* — Nitin Parekh
(74) *Attorney, Agent, or Firm* — Rose Alyssa Keagy; Charles A. Brill; Frank D. Cimino (57) ABSTRACT

A lead frame sheet of flat no-lead lead frames having a semiconductor die on a die pad, terminals, and plastic encapsulation except on a back side of the sheet to provide an exposed thermal die pad, exposed side walls, and exposed back sides of the terminals. A solder wetable metal or metal alloy plating layer is on the back side and on the exposed the walls of the terminals. The exposed thermal pad and the back side of the terminals each include a contact region which lacks the plating layer.

8 Claims, 6 Drawing Sheets

Related U.S. Application Data division of application No. 14/842,460, filed on Sep. 1, 2015, now Pat. No. 9,373,569.

(51) Int. Cl.
- *H01L 23/00* (2006.01)
- *H01L 21/48* (2006.01)
- *H01L 23/29* (2006.01)
- *H01L 23/367* (2006.01)
- *H01L 21/56* (2006.01)
- *H01L 23/31* (2006.01)

(52) U.S. Cl.
CPC ............ *H01L 2224/48091* (2013.01); *H01L 2224/48247* (2013.01); *H01L 2224/48464* (2013.01); *H01L 2224/73265* (2013.01); *H01L 2224/97* (2013.01); *H01L 2924/00014* (2013.01); *H01L 2924/01029* (2013.01); *H01L 2924/181* (2013.01); *H01L 2924/1815* (2013.01); *H01L 2924/19107* (2013.01)

(56) References Cited

U.S. PATENT DOCUMENTS

| | | | |
|---|---|---|---|
| 7,049,177 B1 * | 5/2006 | Fan | H01L 21/4832 257/676 |
| 7,122,406 B1 * | 10/2006 | Yilmaz | H01L 21/4828 257/E21.505 |
| 7,595,225 B1 | 9/2009 | Fan et al. | |
| 8,063,470 B1 * | 11/2011 | Sirinorakul | H01L 21/4832 257/666 |
| 8,866,274 B2 | 10/2014 | Gruber et al. | |
| 2005/0003586 A1 * | 1/2005 | Shimanuki | H01L 21/4832 438/124 |
| 2006/0273433 A1 * | 12/2006 | Itou | H01L 21/4828 257/666 |
| 2007/0001278 A1 * | 1/2007 | Jeon | H01L 21/561 257/676 |
| 2007/0181983 A1 | 8/2007 | Takai et al. | |
| 2008/0150094 A1 * | 6/2008 | Anderson | H01L 23/49541 257/659 |
| 2008/0303134 A1 * | 12/2008 | Li | H01L 21/4832 257/691 |
| 2009/0230524 A1 * | 9/2009 | Chien | H01L 21/4832 257/676 |
| 2010/0187663 A1 | 7/2010 | Celaya et al. | |
| 2012/0052630 A1 | 3/2012 | Lin et al. | |
| 2012/0061819 A1 | 3/2012 | Siemieniec et al. | |
| 2012/0108013 A1 * | 5/2012 | Fujisawa | H01L 21/4842 438/123 |
| 2012/0126378 A1 | 5/2012 | San Antonio et al. | |
| 2012/0306065 A1 | 12/2012 | Bin Mohd Arshad | |
| 2012/0327614 A1 * | 12/2012 | Mahler | H01L 24/83 361/752 |
| 2014/0273352 A1 * | 9/2014 | Higgins, III | H01L 23/49548 438/123 |
| 2014/0377910 A1 | 12/2014 | Tan et al. | |
| 2015/0035166 A1 | 2/2015 | Letterman, Jr. et al. | |
| 2016/0035651 A1 | 2/2016 | Leung et al. | |
| 2016/0254214 A1 * | 9/2016 | Makino | H01L 24/97 257/676 |

\* cited by examiner

FLAT NO-LEAD PACKAGES WITH ELECTROPLATED EDGES

CROSS REFERENCE TO RELATED APPLICATION

This Application is a Continuation of Ser. No. 15/162,807 filed May 24, 2016, which is a Divisional of and claims benefit to U.S. patent application Ser. No. 14/842,460, filed Sep. 1, 2015 that is now U.S. Pat. No. 9,373,569 (granted Jun. 21, 2016), the contents of all are incorporated herein by reference in its entirety.

FIELD

Disclosed embodiments relate to flat no-lead semiconductor packages and assembly processes for such packages.

BACKGROUND

A variety of semiconductor chip packages are known that provide support for an integrated circuit chip (IC) or die and associated bond wires, provide protection from the environment, and enable surface mounting of the die to and interconnection with a printed circuit board (PCB). One conventional package configuration is a flat no-leads package such as quad-flat no-lead (QFN) or and dual-flat no-lead (DFN). Flat no-lead packages, also known as micro leadframe (MLF) and SON (small-outline no leads), is a surface-mount technology, one of several package technologies that connect ICs to the surfaces of PCBs without through-holes. Perimeter lands or terminals exposed on the package bottom provide electrical connections to the PCB. Flat no-lead packages also include an exposed thermal die pad to improve heat transfer out of the IC (into the PCB).

QFNs and DFNs are relatively difficult to solder to because all the terminal connections are on the bottom of the package. Some designs have small extensions for these terminals that wrap around the bottom corner of the package and come up along the edge of the package somewhat. As QFN and DFN packages conventionally comprise copper leadframes, to allow soldering thereto they have added terminal finishes, such as comprising Matt Sn (100% tin) which is applied to the terminals using an electroless (or auto-catalytic by only chemical means) plating process. The QFN/DFN tin coated terminals can then be soldered to a PCB.

Inspection of QFN and DFN packages soldered onto a PCB is typically done with X-ray equipment for an assembly process monitor. The X-ray can detect solder bridging, shorts, opens, voids and solder joint fillets under the leads and exposed pads which are determined as the critical area of termination. For example, the J-STD-002C solderability standard includes a proposed (in ballot) soldering criteria for the QFN/DFN. Some customers (e.g., automotive customers) for QFN packaged semiconductor devices besides requiring a terminal underside solder inspection also require a side solder inspection.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize the use of electroless 100% Sn (tin) for terminal finishes for flat no-lead packages (QFN or DFN) is susceptible to the phenomenon known as tin whiskering. Tin whiskers are known to be electrically conductive single crystal tin eruptions that can grow from surfaces where tin is deposited on a substrate surface, typically being 1 μm to 5 μm in diameter and between 1 μm and 500 μm in length. Such whiskers can cause shorting (e.g., whisker bridging) that reduces yield and can cause reliability problems. Disclosed embodiments recognize an electrolytic (electroplating) terminal finishing process instead of a conventional electroless plating process would remove Sn wiskering, however the need for electrical contact to all surfaces to enable electroplating to take place on all such surfaces eliminates the possibility of using conventional electroplating.

Disclosed methods overcome this harrier to electroplating a terminal finishing metal with an electroplating method by including a removably shorting together step that shorts together all surfaces to be plated which enables electroplating a metal or metal alloy finish onto the QFN/DFN terminals including their edges of a packaged semiconductor device. Disclosed methods include a first partial saw process that exposes sides of the package terminals, followed by removably shorting together (e.g., using a jig or wire bonds) to electrically connect together all the surfaces to be electroplated, removing of the shorting together, and a second sawing step that finishes sawing through the plastic encapsulation to provide singulation to form a plurality of packaged semiconductor devices.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1:
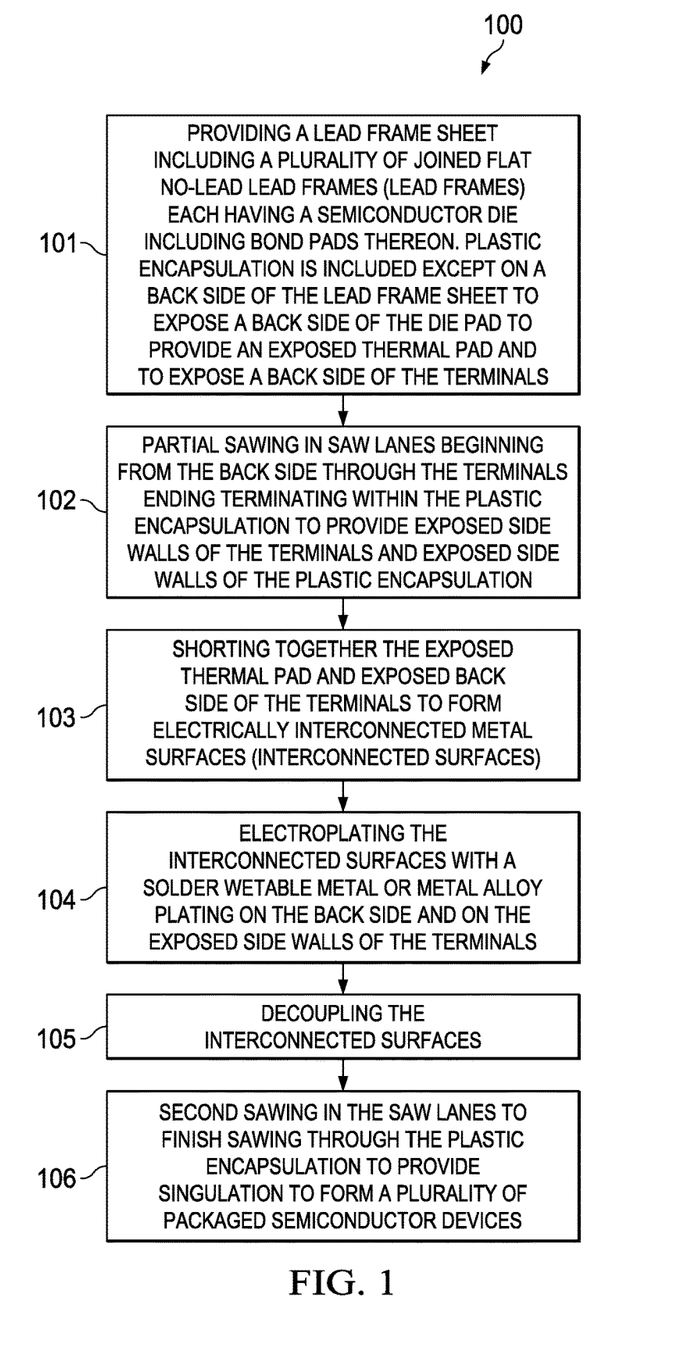
FIG. 1 is a flow chart that shows steps in an example method for forming electroplated terminal finishes including electroplated edges for flat no-lead packages, according to an example embodiment.

FIG. 1 is a flow chart that shows steps in an example method 100 for forming electroplated terminal finishes including electroplated edges for packaged flat no-lead packages, according to an example embodiment. Step 101 comprises providing a lead frame sheet (or lead frame panel) including a plurality of joined flat no-lead lead frames (lead frames) each having a semiconductor die including bond pads thereon mounted on a die pad with bond wires between the bond pads and terminals of the lead frames.

Figure 2A:
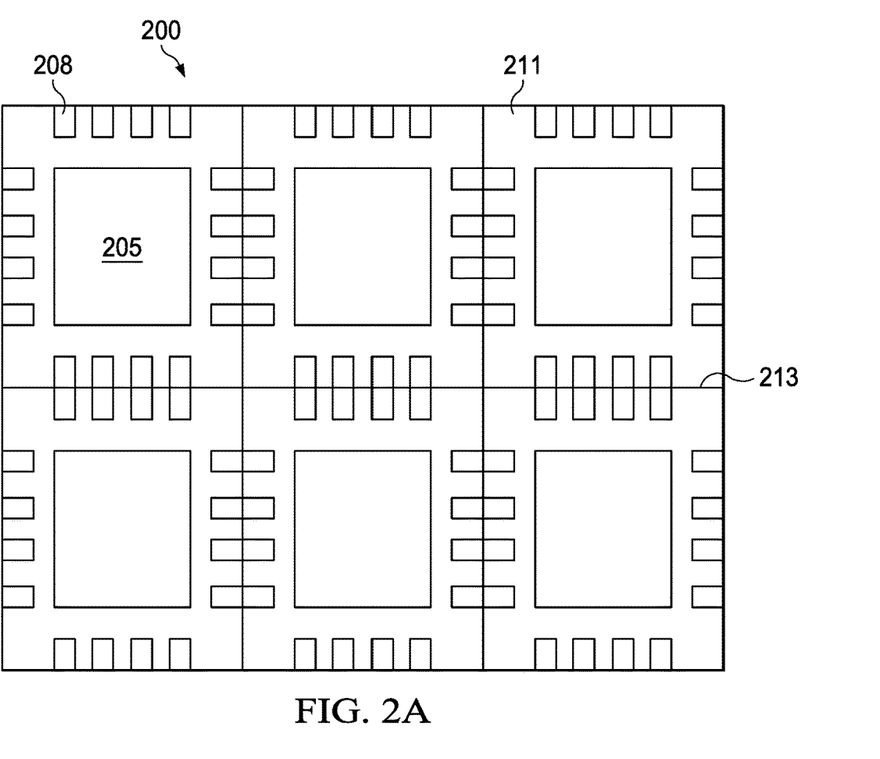
FIG. 2A is a backside and a cross section view of a panel of in-process flat no-lead packages after plastic encapsulation.
Figure 2B:
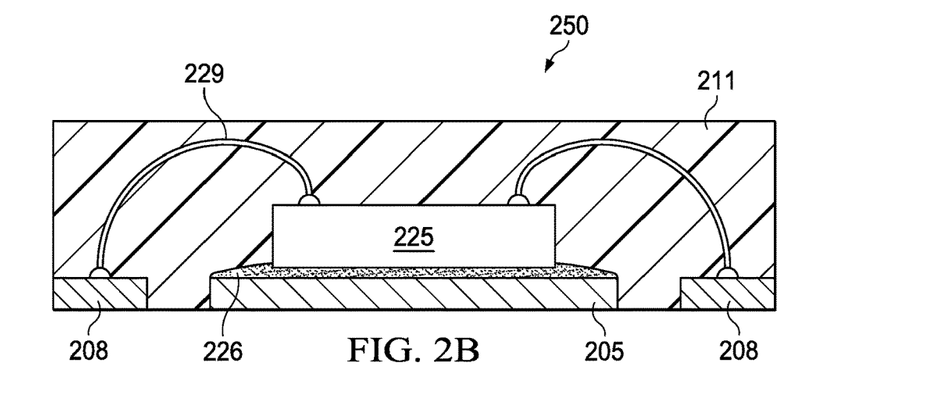
FIG. 2B is a cross section view of a single unit from the panel, according to an example embodiment.

The lead frames typically comprise copper or a copper alloy. Plastic encapsulation is included except on a back side of the lead frame sheet to expose a back side of the die pad to provide an exposed thermal pad and to expose a back side of the terminals. The lead frames can comprise quad-flat no-lead (QFN) or dual-flat no-lead (DFN). FIGS. 2A and 2B show a backside view of a panel 200 showing six (6) in-process flat no-lead packages after plastic encapsulation showing the plastic 211, and the exposed die pad 205 and exposed terminals 208, and FIG. 2B shows a cross section view of a single unit 250 from the panel, according to an example embodiment. Saw lanes for step 102 described below are shown as 213. The semiconductor die is shown as 225 and the die attach material (e.g., an epoxy) as 226. Bond wires 229 are shown connecting bond pads on the top surface of semiconductor die 225 to the terminals 208.

Figure 3A:
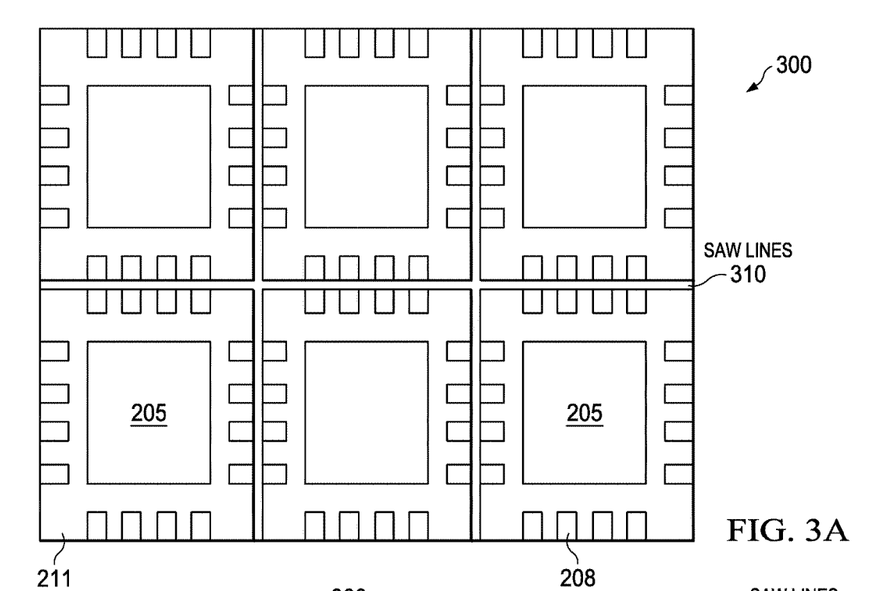
FIGS. 3A and 3B is a backside and a cross section view of a panel of in-process flat no-lead packages after backside partial sawing, respectfully, according to an example embodiment.
Figure 3B:
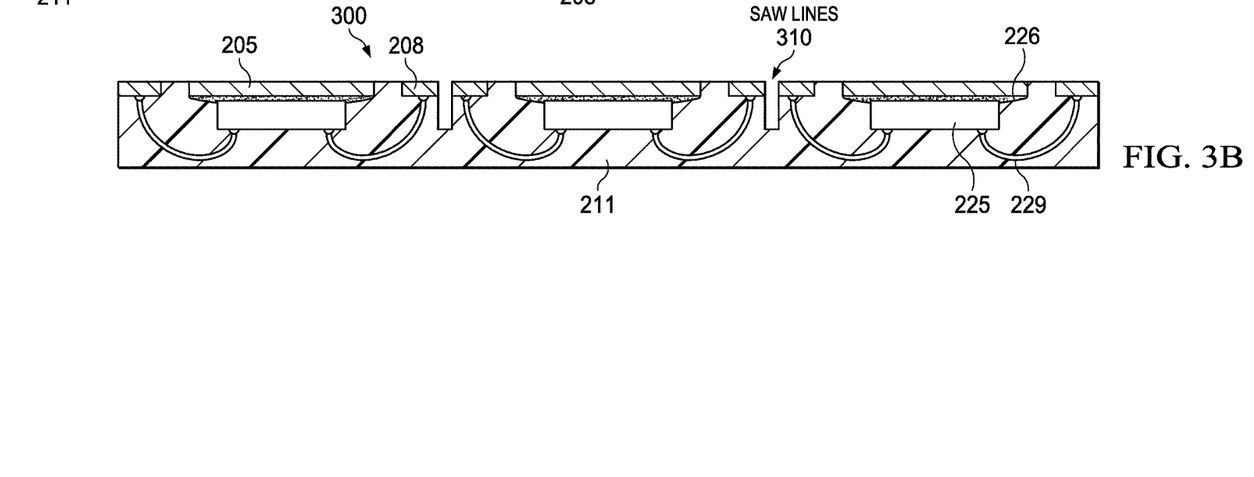

Step 102 comprises partial sawing in the saw lanes beginning from the back side through the terminals ending with saw lines having a line width terminating within the plastic encapsulation to provide exposed side walls of the terminals and exposed side walls of the plastic encapsulation. The partial sawing can comprise mechanical sawing or laser sawing. FIGS. 3A and 3B show backside and a cross section view, respectively, of a panel 300 of in-process flat no-lead packages after backside partial sawing using the saw lanes 213 shown in FIG. 2A to form saw lines 310, according to an example embodiment.

Figure 4:
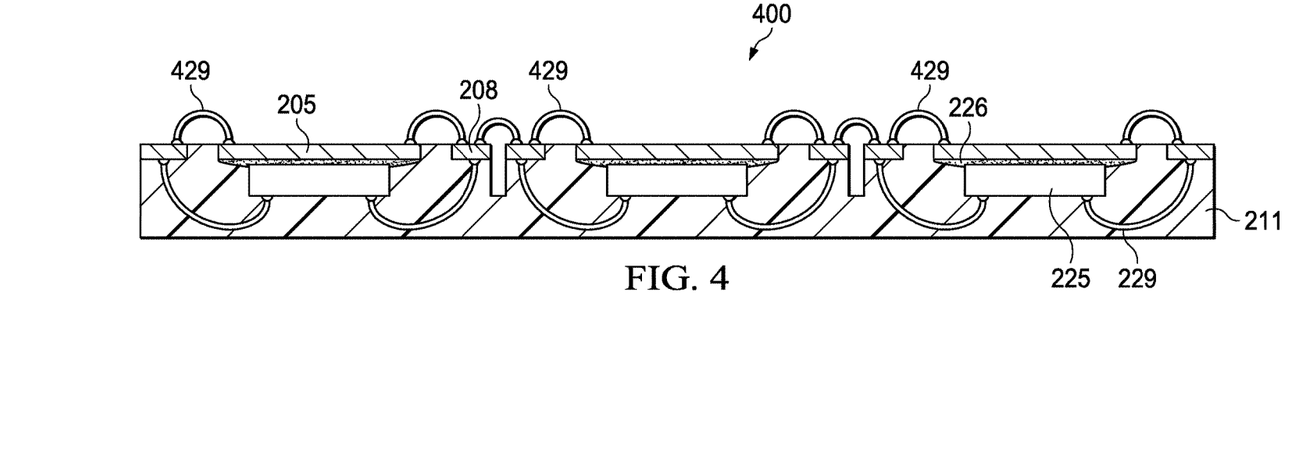
FIG. 4 is a cross section view of a panel of in-process flat no-lead packages after backside wirebonding, according to an example embodiment.

Step 103 comprises shorting together (e.g., using a jig (essentially a bed of nails), jumper, or wire bonding) all the exposed thermal pad(s) and exposed back side of the terminals to form electrically interconnected metal surfaces (interconnected surfaces). FIG. 4 is a cross section view of a panel 400 of in-process flat no-lead packages after backside wirebonding, according to an example embodiment. Wirebonds to provide the electrically interconnected surfaces are shown as bond wires 429.

Figure 5A:
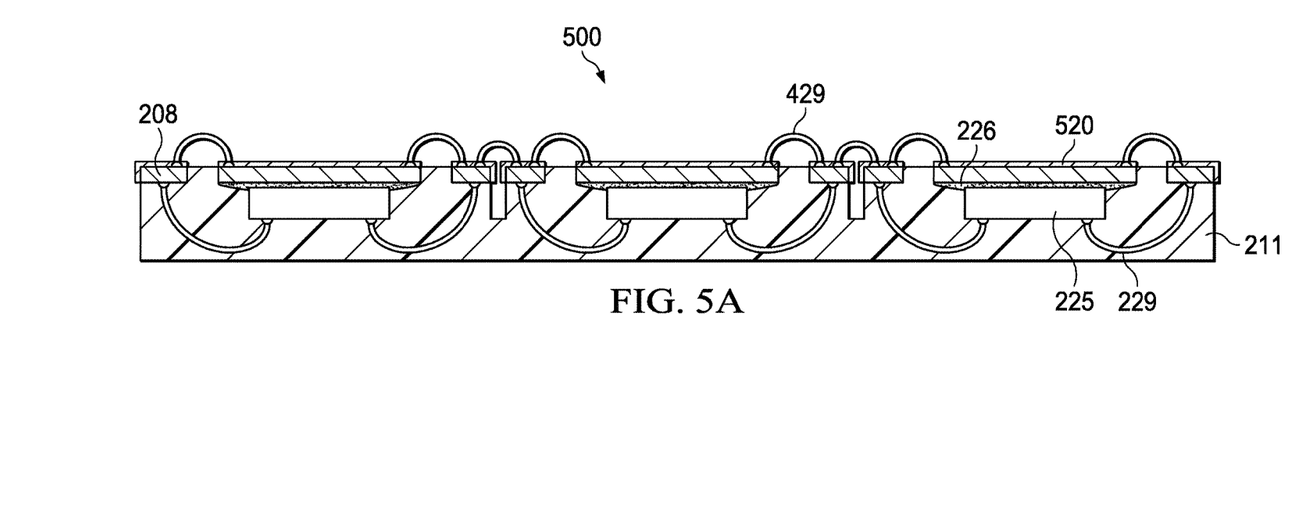
FIG. 5A is a cross section view of a panel of in-process flat no-lead packages after electroplating the terminals along with their edges, according to an example embodiment.

Step 104 comprises electroplating the interconnected surfaces with a solder wetable metal or metal alloy plating layer on the back side and on the exposed side walls of the terminals. Electroplating as known in the art is a process that uses electrical current from a power supply to reduce dissolved metal cations in a plating solution so that they form a metal coating on the desired surface to be plated that is configured as a cathode. FIG. 5A is a cross section view of a panel 500 of in-process flat no-lead packages after electroplating a plating layer 520 on the terminals being the exposed die pads 205 and exposed terminals 208, according to an example embodiment.

Figure 5B:
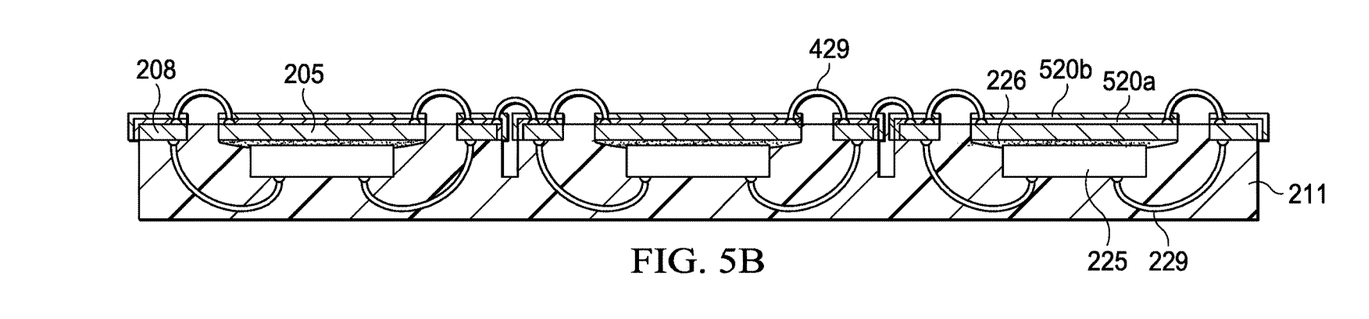
FIG. 5B is a cross section view of a panel of in-process flat no-lead packages after electroplating the terminals along with their edges with 2 plating layers, according to an example embodiment.

Although the plating layer 520 is shown as a single layer, the plating layer can comprise a stack of different plating layers, such as the stack of plating layers in one particular embodiment being NiPdAu (3 layers). FIG. 5B is a cross section view of a panel of in-process flat no-lead packages after electroplating the terminals along with their edges with 2 plating layers shown 520b on 520a, according to an example embodiment. Because of the bond wires 429 or other shorting structures being present during the electroplating the exposed thermal pad 205 and back side of the terminals 208 each include a contact region (see contact region 615 shown in FIG. 6) having an area of about that of the bond wire which lacks the plating layer. The contact region is generally 0.8 mil (0.206 mm) to 5 mil (0.127 mm) in diameter, and is typically 1 to 2 mils in diameter.

Figure 6:
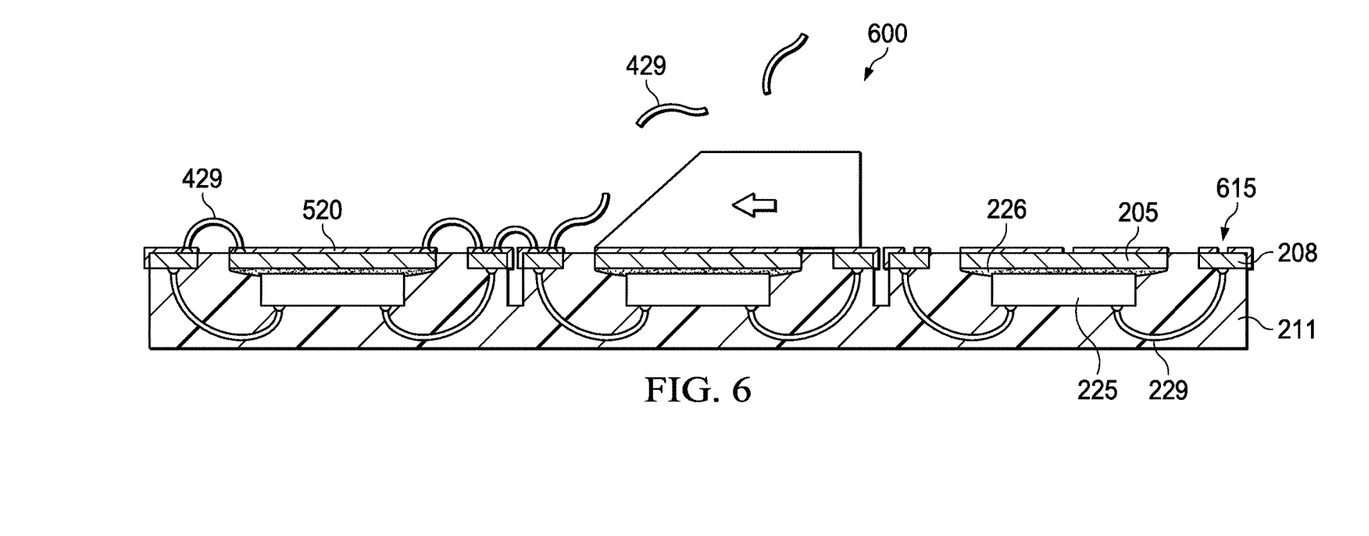
FIG. 6 is a cross section view of a panel of in-process flat no-lead packages depicting the shearing off the wirebonds without damaging the plating layer on the terminals, and the resulting wirebond contact regions on the exposed thermal die pad (exposed thermal pad) and back side of the terminals which lack the plating layer, according to an example embodiment.

Step 105 comprises decoupling the interconnected surfaces. When the shorting together comprises using bond wires, the decoupling can comprise using a metal brush for shearing off the bond wires. In the case of a jig, the jig is lifted up to remove the contacts of its nails or probes with the terminals. FIG. 6 is a cross section view of a panel 600 of in-process flat no-lead packages depicting the shearing off the bond wires 429 without damaging plating layer 520 on the terminals, according to an example embodiment. The exposed thermal pad 205 and back side of the terminals 208 can be seen to each include a contact region 615 which lacks the plating layer 520.

Figure 7A:
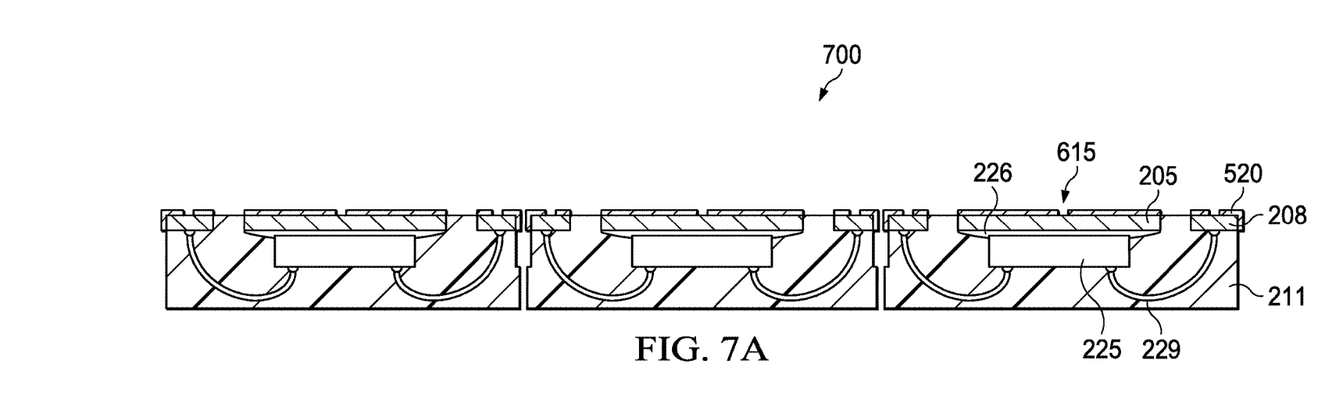
FIG. 7A is a cross section view of a panel of in-process flat no-lead packages depicting the result after finishing with a smaller saw that runs all the way through the plastic encapsulation to provide package singulation with 3 singulated package units shown.
Figure 7B:
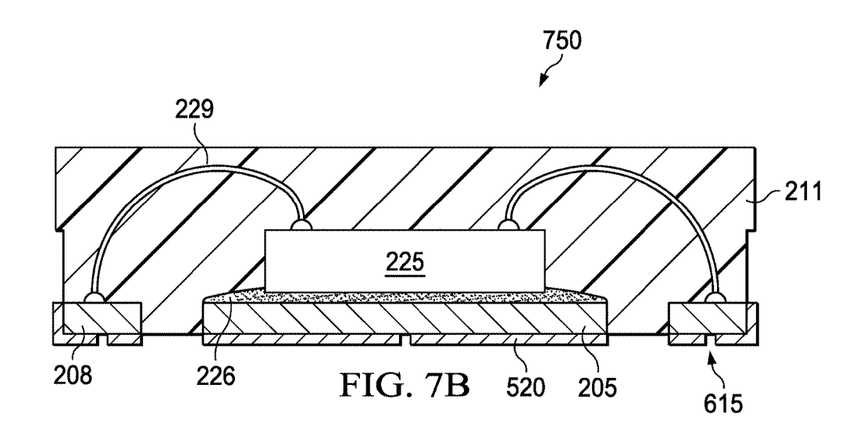
FIG. 7B is a cross section view of a panel of one of the singulated package units shown in FIG. 7A inverted 180 degrees.

Step 106 comprises a second sawing in the saw lanes to finish sawing beginning from the bottom of the saw lines through the plastic encapsulation 211 to provide singulation to form a plurality of packaged semiconductor devices. FIG. 7A is a cross section view of a panel 700 of in-process flat no-lead packages depicting the result after finishing with a smaller saw that runs all the way through the plastic encapsulation 211 to provide package singulation with 3 singulated package units shown. FIG. 7B is a cross section view of a panel of one of the singulated package units shown in FIG. 7A identified as 750 inverted 180 degrees to have its top side up.

Advantages of disclosed methods and packaged semiconductor devices therefrom include the elimination of tin whiskering. Side wetting is also provided to enable a visual solder inspection instead of having to conventionally rely on an x-ray inspection for electrolytic processes.

Disclosed embodiments can be integrated into a variety of assembly flows to form a variety of different semiconductor integrated circuit (IC) devices and related products. The assembly can comprise single semiconductor die or multiple semiconductor die, such as package on package (PoP)

configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of forming packaged semiconductor devices, comprising:

provid­ing a lead frame sheet including a plurality of joined flat no-lead lead frames (lead frames) each having a semiconductor die including bond pads thereon mounted on a die pad of said lead frames with bond wires between said bond pads and terminals of said lead frames, and plastic encapsulation except on a back side of said lead frame sheet to expose a back side of said die pad to provide an exposed thermal die pad and to expose a back side of said terminals;

partial sawing in saw lanes beginning from said back side of said lead frame sheet through said terminals ending with saw lines having a line width terminating within said plastic encapsulation to provide exposed side walls of said terminals and exposed side walls of said plastic encapsulation;

shorting together said exposed thermal pad and said exposed back side of the terminals to form electrically interconnected metal surfaces;

electroplating said electrically interconnected metal surfaces with a stack of plating layers on said back side and on said exposed side walls of said terminals, said stack of plating layers includes nickel, palladium, and gold;

decoupling said interconnected surfaces, and a second sawing in said saw lanes to finish sawing through said plastic encapsulation to provide singulation to form a plurality of said packaged semiconductor devices.

2. The method of claim 1, wherein said partial sawing includes mechanical sawing or laser sawing.

3. The method of claim 1, where said shorting together includes wire bonding bond wires and wherein said decoupling includes using a metal brush for shearing off said bond wires.

4. The method of claim 1, wherein said lead frames comprise quad-flat no-lead (QFN) or dual-flat no-lead (DFN).

5. The method of claim 1, wherein said shorting together includes using a metal jig.

6. The method of claim 1, wherein a sawn width for said second sawing is less than said line width.

7. The method of claim 1, wherein said exposed thermal pad and said back side of said terminals each include a contact region which lacks said plating layer.

8. The method of claim 1, wherein said lead frames include copper or a copper alloy.

* * * * *